(12) United States Patent
Hosobuchi

(10) Patent No.: US 7,366,010 B2
(45) Date of Patent: *Apr. 29, 2008

(54) MAGNETIC MEMORY

(75) Inventor: Toshikazu Hosobuchi, Tokyo (JP)

(73) Assignee: TDK Corporation, Tokyo (JP)

( * ) Notice: Subject to any disclaimer, the term of this patent is extended or adjusted under 35 U.S.C. 154(b) by 90 days.

This patent is subject to a terminal disclaimer.

(21) Appl. No.: 11/330,196

(22) Filed: Jan. 12, 2006

(65) Prior Publication Data

US 2006/0186443 A1    Aug. 24, 2006

(30) Foreign Application Priority Data

Jan. 13, 2005    (JP)    ............... P2005-006647

(51) Int. Cl.
    *G11C 11/15*    (2006.01)
(52) U.S. Cl. .............. 365/158; 365/171; 365/173; 257/421
(58) Field of Classification Search ............... 365/157
    See application file for complete search history.

(56) References Cited

U.S. PATENT DOCUMENTS

| | | | | |
|---|---|---|---|---|
| 5,432,734 A * | 7/1995 | Kawano et al. | ............ | 365/158 |
| 5,738,938 A * | 4/1998 | Kawano et al. | ............ | 428/332 |
| 5,768,181 A * | 6/1998 | Zhu et al. | ............ | 365/158 |
| 6,125,019 A * | 9/2000 | Hoshiya et al. | ......... | 360/324.1 |
| 6,347,049 B1 * | 2/2002 | Childress et al. | .......... | 365/173 |
| 6,404,673 B1 * | 6/2002 | Matsui | ............ | 365/173 |
| 6,469,926 B1 * | 10/2002 | Chen | ............ | 365/158 |
| 6,628,542 B2 * | 9/2003 | Hayashi et al. | ............ | 365/158 |
| 6,667,901 B1 * | 12/2003 | Perner et al. | ............ | 365/173 |
| 6,714,444 B2 | 3/2004 | Huai et al. | | |
| 6,754,100 B1 * | 6/2004 | Hayakawa | ............ | 365/173 |
| 6,934,133 B2 * | 8/2005 | Hayakawa et al. | ...... | 360/324.2 |
| 6,956,766 B2 * | 10/2005 | Nakamura et al. | .......... | 365/171 |
| 6,972,992 B1 * | 12/2005 | Fukuzumi et al. | .......... | 365/173 |
| 7,023,723 B2 * | 4/2006 | Daughton et al. | .......... | 365/158 |
| 2006/0203538 A1 * | 9/2006 | Koga | ............ | 365/158 |

FOREIGN PATENT DOCUMENTS

| | | |
|---|---|---|
| JP | A 11-120758 | 4/1999 |
| JP | A 2003-204095 | 7/2003 |
| JP | A 2004-153182 | 5/2004 |

OTHER PUBLICATIONS

Sun, et al., "Spin-Torque Transfer in Batch-Fabricated Spin-Valve Magnetic Nanojunctions (Invited)," Journal of Applied Physics, vol. 93, No. 10, pp. 6859-6863, May 15, 2003.

Mizukami, et al., "Spin Pumping in Ferromagnetic-Metal/Normal-Metal Junctions," Journal of the Magnetic Society of Japan, vol. 27, No. 9, pp. 934-939, 2003.

* cited by examiner

*Primary Examiner*—Tan T. Nguyen
(74) *Attorney, Agent, or Firm*—Oliff & Berridge, PLC

(57) ABSTRACT

A TMR element has a free first magnetic layer, a second magnetic layer with a magnetization direction B fixed, a nonmagnetic insulating layer provided between the first magnetic layer and the second magnetic layer, a third magnetic layer provided above a surface of the first magnetic layer and having a fixed magnetization direction, and a first nonmagnetic conductive layer provided between the first magnetic layer and the third magnetic layer, and an area of a cross section of the first magnetic layer perpendicular to a stack direction is not less than 0.001 $\mu m^2$, and less than 0.02 $\mu m^2$.

7 Claims, 12 Drawing Sheets

Fig.6

| SECTIONAL AREA (μm²) | WRITE CURRENT (mA) | | | |
|---|---|---|---|---|
| | AT CURRENT DENSITY OF 5×10⁷ (A/cm²) | AT CURRENT DENSITY OF 1×10⁷ (A/cm²) | AT CURRENT DENSITY OF 2×10⁶ (A/cm²) |
| 0.0005 | 0.25 | 0.05 | 0.01 |
| 0.001 | 0.5 | 0.1 | 0.02 |
| 0.005 | 2.5 | 0.5 | 0.1 |
| 0.01 | 5 | 1 | 0.2 |
| 0.02 | 10 | 2 | 0.4 |
| 0.05 | 25 | 5 | 1 |
| 0.1 | 50 | 10 | 2 |
| 0.2 | 100 | 20 | 4 |
| 0.8 | 400 | 80 | 16 |
| 1 | 500 | 100 | 20 |
| 2 | 1000 | 200 | 40 |
| 5 | 2500 | 500 | 100 |

MAGNETIC MEMORY

BACKGROUND OF THE INVENTION

1. Field of the Invention

The present invention relates to a magnetic memory for storing data in magnetoresistive effect elements.

2. Related Background Art

An MRAM (Magnetic Random Access Memory) with magnetoresistive effect elements is presently drawing attention as a storage device used in information processing apparatus such as computers and communication equipment. The MRAM is a type of memory that stores data by magnetism, and is thus free of such inconvenience that information is lost with power discontinuity, different from the DRAM (Dynamic Random Access Memory) and SRAM (Static RAM) being volatile memories. In addition, the MRAM is much superior in access speed, reliability, power consumption, etc. to nonvolatile storage means such as the conventional flash EEPROM (Electronically Erasable and Programmable Read Only Memory) and hard disk drives. Therefore, the MRAM holds the potential to replace all the function of the volatile memories such as the DRAM and SRAM and the function of the nonvolatile storage means such as the flash EEPROM and hard disk drives. Nowadays, there are rapidly ongoing efforts to develop information equipment aiming at so-called ubiquitous computing to enable information processing anytime and anywhere, and the MRAM is expected to play a role as a key device in such information equipment.

The magnetoresistive effect elements are elements making use of the Giant Magneto-Resistive (GMR) effect or the Tunneling Magneto-Resistive (TMR) effect, for example. The GMR effect is a phenomenon in which the resistance of ferromagnetic layers in a direction perpendicular to a stack direction thereof varies according to a relative angle between magnetization directions of two ferromagnetic layers with a nonmagnetic layer in between. Namely, in the case of the giant magnetoresistive effect element (GMR element) making use of the GMR effect, the resistance of the ferromagnetic layers becomes minimum when the magnetization directions of the two ferromagnetic layers are parallel to each other, and the resistance is maximum when they are antiparallel. The TMR effect is a phenomenon in which the resistance between two ferromagnetic layers varies according to a relative angle between magnetization directions of two ferromagnetic layers with a thin insulating layer in between. Namely, in the case of the tunneling magnetoresistive effect element (TMR element) making use of the TMR effect, the resistance between the ferromagnetic layers becomes minimum when the magnetization directions of the two ferromagnetic layers are parallel, and the resistance becomes maximum when they are antiparallel. The MRAM with such magnetoresistive effect elements is able to store binary data (0 or 1) by a state of the magnetization directions between two ferromagnetic layers (parallel or antiparallel). Then the binary data can be read out of the magnetoresistive effect element by measuring the resistance based on the state of the magnetization directions.

Particularly, the TMR element among these magnetoresistive effect elements can achieve a large resistance change rate, e.g., 40% or more. Since the TMR element has a relatively high resistance, it can be readily combined with a semiconductor device such as a MOS-FET. Therefore, stored data can be stably read out by a relatively small current and there are thus hopes for increase in storage capacity and for improvement in operation speed. An MRAM using the TMR effect is a magnetic memory disclosed, for example, in Patent Document 1 (Japanese Patent Application Laid-Open No. 2004-153182).

SUMMARY OF THE INVENTION

The MRAM with the magnetoresistive effect elements has a lot of advantages as described above. However, the currently available MRAMs are constructed to vary the direction of magnetization in one ferromagnetic layer (magnetosensitive layer) by a magnetic field generated by an electric current flowing in a write line disposed near the magnetoresistive effect element, as is the case in the configuration disclosed in Patent Document 1. In this configuration, the magnetic field of the electric current from the write line is also radiated into directions except for the direction toward the magnetoresistive effect element as an object to be written, and it can cause erroneous writing in other magnetoresistive effect elements.

Furthermore, where the direction of magnetization in the magnetosensitive layer is varied by the magnetic field of the electric current from the write line, a demagnetizing field will increase inside the magnetosensitive layer with decrease in a ratio of planar size to thickness of the magnetosensitive layer. Accordingly, as the size of the magnetoresistive effect element is decreased in order to achieve higher integration of the MRAM, the magnetic field strength necessary for varying the direction of magnetization in the magnetosensitive layer increases, so as to require a large write current. For realizing the large write current, a transistor for controlling the write current will become larger. For this reason, achievement of higher integration is difficult with the MRAM in the configuration to vary the direction of magnetization in the magnetosensitive layer by the magnetic field of the electric current.

The present invention has been accomplished in view of the problem described above, and an object of the invention is to provide a magnetic memory capable of preventing erroneous writing and facilitating achievement of higher integration.

In order to solve the above problem, a first magnetic memory according to the present invention is a magnetic memory comprising a plurality of storage areas each of which has a magnetoresistive effect element, wherein the magnetoresistive effect element comprises: a first magnetic layer which contains a ferromagnetic material and a magnetization direction of which varies according to a density and a spin direction of an electric current flowing in a stack direction; a second magnetic layer which contains a ferromagnetic material, which is provided above one surface of the first magnetic layer, and a magnetization direction of which is fixed; a nonmagnetic layer which contains a nonmagnetic material and which is provided between the first magnetic layer and the second magnetic layer; a third magnetic layer which contains a ferromagnetic material, which is provided above another surface of the first magnetic layer, and a magnetization direction of which is fixed; and a first nonmagnetic conductive layer which contains a nonmagnetic and electrically conductive material and which is provided between the first magnetic layer and the third magnetic layer, and wherein an area of a cross section of the first magnetic layer perpendicular to the stack direction is not less than 0.001 $\mu m^2$, and less than 0.02 $\mu m^2$.

A second magnetic memory according to the present invention is a magnetic memory comprising a plurality of storage areas each of which has a tunneling magnetoresistive effect element, wherein the tunneling magnetoresistive effect element comprises: a first magnetic layer which contains a ferromagnetic material and a magnetization direction of which varies according to a density and a spin direction of an electric current flowing in a stack direction; a second magnetic layer which contains a ferromagnetic material, which is provided above one surface of the first magnetic layer, and a magnetization direction of which is fixed; a nonmagnetic insulating layer which contains a nonmagnetic and insulating material and which is provided between the first magnetic layer and the second magnetic layer; a third magnetic layer which contains a ferromagnetic material, which is provided above another surface of the first magnetic layer, and a magnetization direction of which is fixed; and a first nonmagnetic conductive layer which contains a nonmagnetic and electrically conductive material and which is provided between the first magnetic layer and the third magnetic layer, and wherein an area of a cross section of the first magnetic layer perpendicular to the stack direction is not less than 0.001 $\mu m^2$, and less than 0.02 $\mu m^2$.

In the above-described first and second magnetic memories, the (tunneling) magnetoresistive effect element comprises the first nonmagnetic conductive layer between the first magnetic layer with the varying magnetization direction and the third magnetic layer with the fixed magnetization direction. When an electric current is allowed to flow in the stack direction in the laminate of this configuration, the spin direction of the electric current is filtered at the interface (junction) between the third magnetic layer and the first nonmagnetic conductive layer, to generate a spin-polarized current with the spin direction biased. When the spin-polarized current over a certain current density flows in the first magnetic layer, it causes a change in the magnetization direction of the first magnetic layer (magnetization reversal).

In the foregoing first and second magnetic memories, as described above, the magnetization direction of the first magnetic layer can be changed by the direct flow of the electric current in the magnetoresistive effect element, instead of the external magnetic field like the magnetic field of the electric current. In addition, the spin-polarized current is generated by the third magnetic layer and the first nonmagnetic conductive layer, and therefore the magnetization direction can be varied by a relatively small electric current. Therefore, the above-described first or second magnetic memory is able to prevent erroneous writing in magnetoresistive effect elements other than the magnetoresistive effect element as an object to be written.

In the above-described first and second magnetic memories, the magnetization direction is varied by the spin-polarized current; therefore, it prevents increase in the demagnetizing field inside the first magnetic layer and, in addition, the smaller the planar size of the first magnetic layer, the smaller the electric current necessary for the variation of the magnetization direction becomes. With the aforementioned first or second magnetic memory, therefore, it becomes feasible to achieve miniaturization of the magnetoresistive effect element and to readily achieve higher integration of the magnetic memory.

Furthermore, in the aforementioned first and second magnetic memories, the area of the cross section of the first magnetic layer perpendicular to the stack direction in the magnetoresistive effect element is not less than 0.001 $\mu m^2$. For reading data stored in the magnetoresistive effect element, a read current is supplied to the magnetoresistive effect element and a resistance of the magnetoresistive effect element is measured, for example, by detecting a voltage drop in the magnetoresistive effect element. According to Inventor's knowledge, this read current is preferably at least 0.1 mA in order to accurately measure the resistance by the magnetoresistive effect, without being affected by noise or the like. On the other hand, where magnetization of the first magnetic layer is reversed by a spin-polarized current to write data in a magnetoresistive effect element, a density of a write current to be supplied to the first magnetic layer is preferably not less than $1\times10^7$ A/cm$^2$ in order to securely reverse the magnetization direction. In addition, the minimum write current for reversal of the magnetization direction of the first magnetic layer needs to be larger than the read current in order to prevent the magnetization direction of the first magnetic layer from being reversed by the read current. It is seen from these that when the area of the cross section of the first magnetic layer perpendicular to the stack direction is not less than 0.001 $\mu m^2$ with which the electric current of 0.1 mA is satisfied at the current density of $1\times10^7$ A/cm$^2$, the resistance by the magnetoresistive effect can be accurately measured in reading of data and magnetization of the first magnetic layer can be suitably reversed by the spin-polarized current in writing of data.

In the aforementioned first and second magnetic memories, the area of the cross section of the first magnetic layer perpendicular to the stack direction in the magnetoresistive effect element is less than 0.02 $\mu m^2$. According to Inventors knowledge, when the write current is not less than 10 mA, a switching element such as a transistor for controlling conduction of the write current in each storage area, becomes too large in size, and there is a limit to achievement of higher integration of the magnetic memory, even with miniaturization of the magnetoresistive effect element. For securely reversing the magnetization direction of the first magnetic layer, the density of the write current to be supplied to the first magnetic layer is at most $5\times10^7$ A/cm$^2$. Therefore, when the area of the cross section of the first magnetic layer perpendicular to the stack direction is less than 0.02 $\mu m^2$ with which the electric current of 10 mA is satisfied at the current density of $5\times10^7$ A/cm$^2$, it becomes feasible to achieve miniaturization of the switching elements and magnetoresistive effect elements together and to achieve higher integration of the magnetic memory.

The aforementioned second magnetic memory comprises the tunneling magnetoresistive effect elements (TMR elements) as magnetoresistive effect elements. Namely, the nonmagnetic insulating layer is provided as a nonmagnetic layer between the first magnetic layer and the second magnetic layer. This produces the TMR effect between the first magnetic layer and the second magnetic layer, so as to achieve a relatively large resistance change rate by variation of the magnetization direction of the first magnetic layer. Therefore, data stored by the magnetization direction of the first magnetic layer can be quickly and stably read out.

The first or second magnetic memory may be characterized in that a thickness of the second magnetic layer in the stack direction is larger than a thickness of the first magnetic layer in the stack direction. The first or second magnetic memory may also be characterized in that an area of a cross section of the second magnetic layer perpendicular to the stack direction is larger than an area of a cross section of the first magnetic layer perpendicular to the stack direction. At least one of these configurations can effectively prevent disturbance of the magnetization direction of the second magnetic layer due to the electric current for varying the magnetization direction of the first magnetic layer, and stably retain the magnetization direction of the second magnetic layer.

The first or second magnetic memory may be characterized in that a thickness of the third magnetic layer in the stack direction is larger than a thickness of the first magnetic layer in the stack direction. This can effectively prevent disturbance of the magnetization direction of the third magnetic layer due to the electric current for varying the magnetization direction of the first magnetic layer, and stably retain the magnetization direction of the third magnetic layer.

The first or second magnetic memory may further comprise an antiferromagnetic layer containing an antiferromagnetic material and provided on a surface opposite to a surface of the second magnetic layer opposed to the first magnetic layer. In another configuration, the first or second magnetic memory may further comprise a fourth magnetic layer containing a ferromagnetic material and provided above a surface opposite to a surface of the second magnetic layer opposed to the first magnetic layer; and a second nonmagnetic conductive layer containing a nonmagnetic and electrically conductive material and provided between the second magnetic layer and the fourth magnetic layer. Either one of these configurations effects exchange coupling or antiferromagnetic coupling between the antiferromagnetic layer or the fourth magnetic layer and the second magnetic layer, and can stably retain the magnetization direction of the second magnetic layer.

The magnetic memories according to the present invention are able to prevent erroneous writing and to facilitate achievement of higher integration.

BRIEF DESCRIPTION OF THE DRAWINGS

FIG. 6 is a table showing write current values with variation in the area of the cross section of the first magnetic layer perpendicular to the stack direction.

DESCRIPTION OF THE PREFERRED EMBODIMENT

An embodiment of the magnetic memory according to the present invention will be described below in detail with reference to the accompanying drawings. In the description of the drawings the same elements will be denoted by the same reference symbols, without redundant description.

Figure 1:
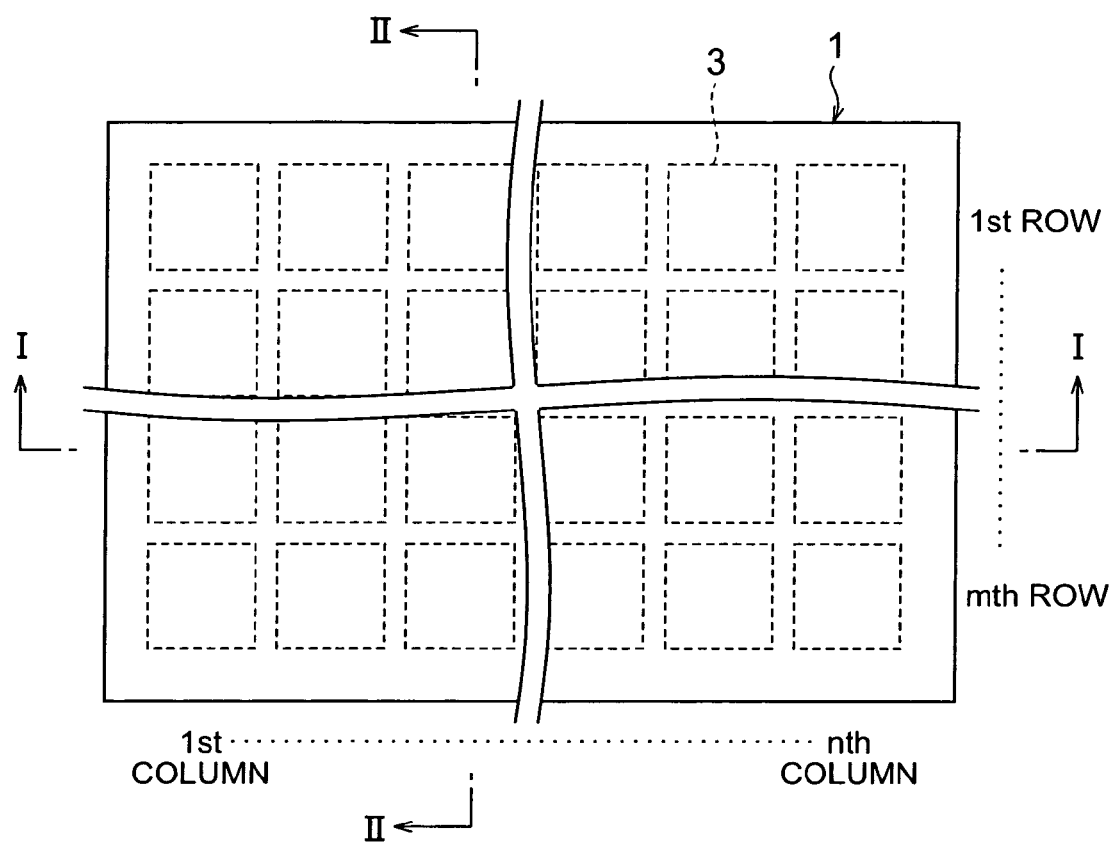
FIG. 1 is a plan view of a magnetic memory.

First described is a configuration of an embodiment of the magnetic memory according to the present invention. FIG. 1 is a plan view of magnetic memory 1 according to the present embodiment. The magnetic memory 1 has a plurality of storage areas 3. The plurality of storage areas 3 are arranged in a two-dimensional array of m rows and n columns (each of m and n is an integer of not less than 2). Each of the storage areas 3 has a magnetoresistive effect element such as a TMR element.

Figure 2:
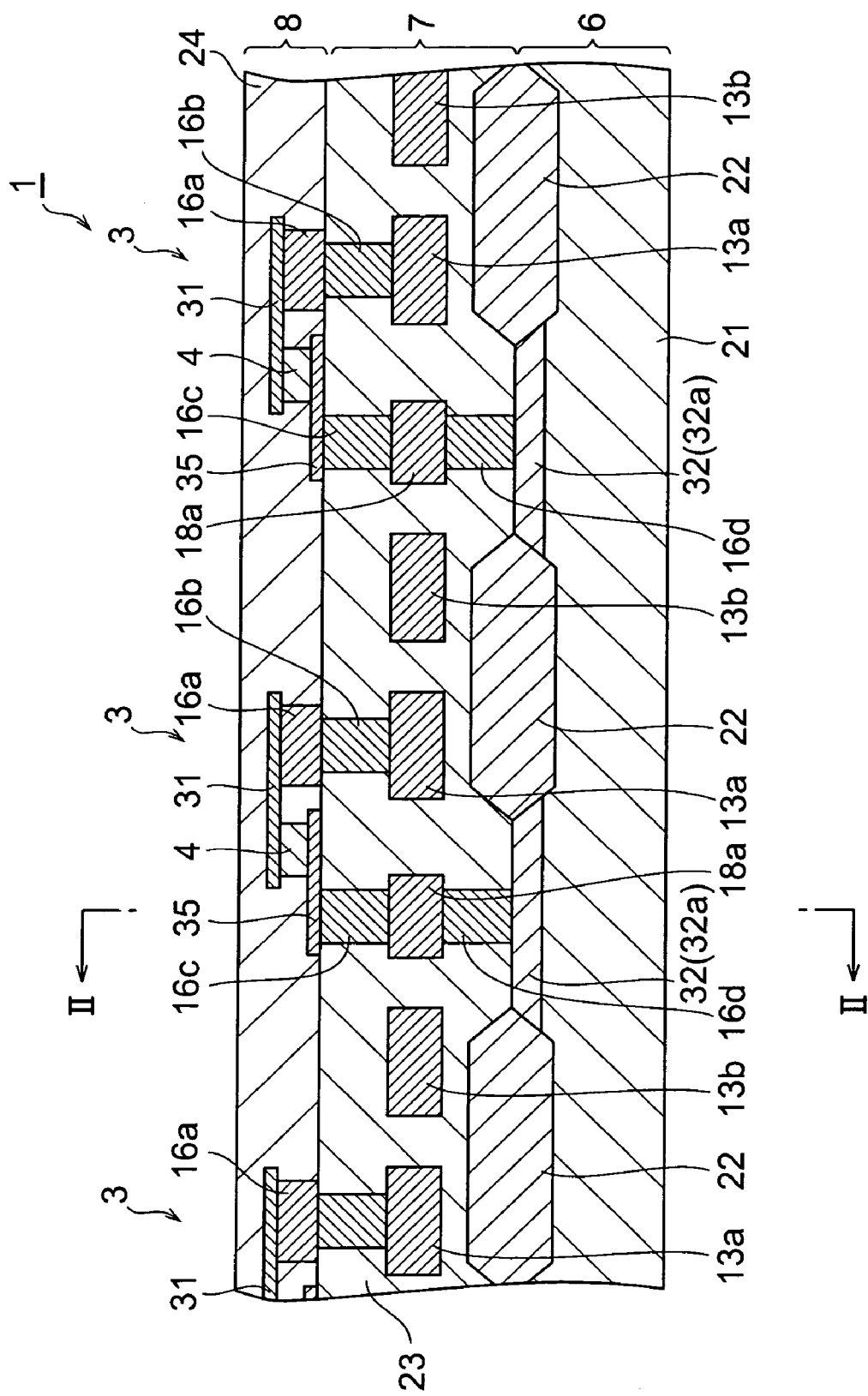
FIG. 2 is a sectional view of the magnetic memory shown in FIG. 1, cut on line I-I along a row direction.
Figure 3:
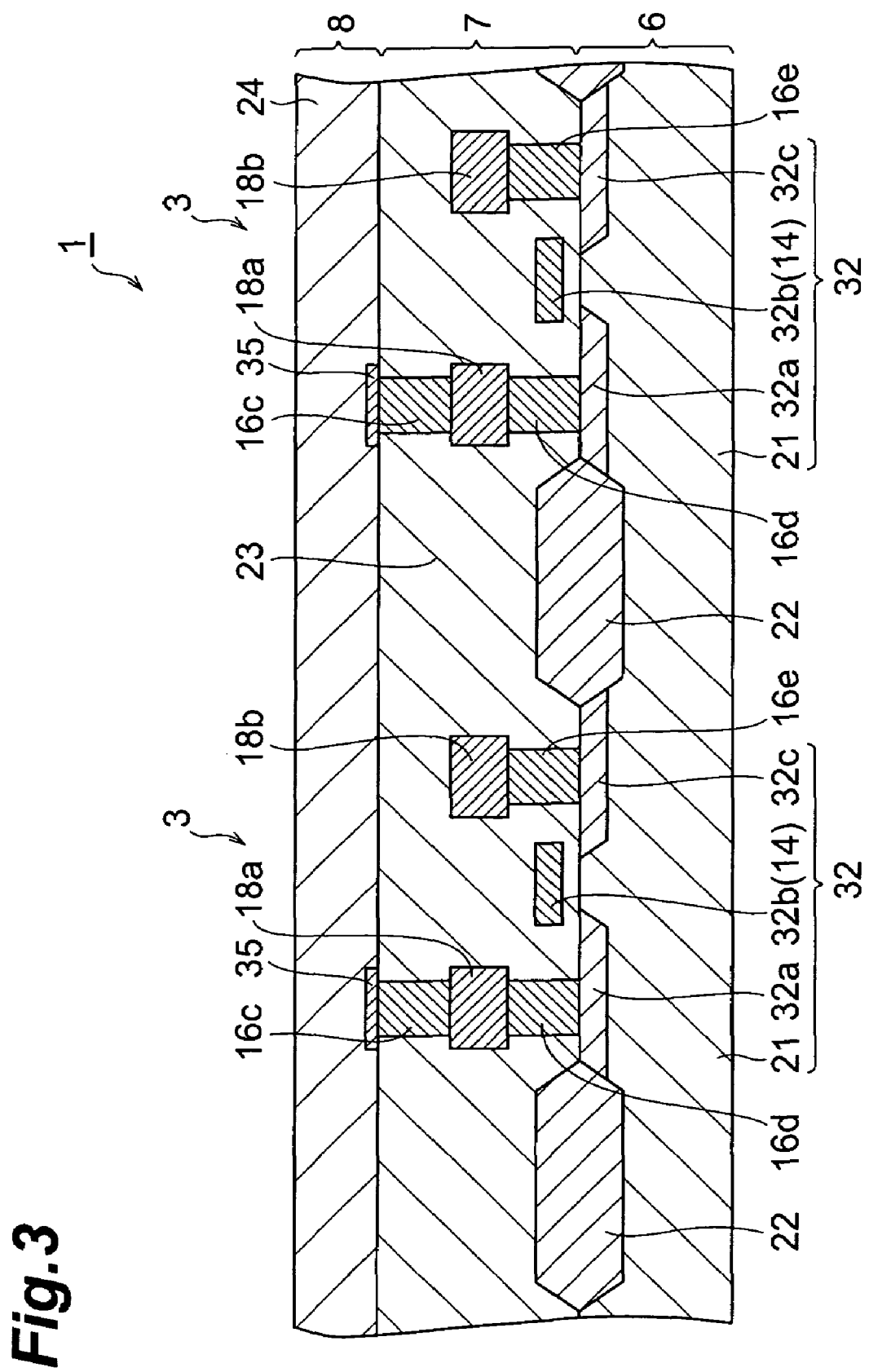
FIG. 3 is a sectional view of the magnetic memory shown in FIGS. 1 and 2, cut on line II-II along a column direction.

FIG. 2 is a sectional view of the magnetic memory 1 shown in FIG. 1, cut on line I-I along the row direction. FIG. 3 is a sectional view of the magnetic memory 1 shown in FIGS. 1 and 2, cut on line II-II along the column direction. With reference to FIGS. 2 and 3, the magnetic memory 1 has a semiconductor layer 6, a wiring layer 7, and a magnetic material layer 8. The magnetic memory 1 has TMR elements 4, bit lines 13a and 13b, word lines 14, a semiconductor substrate 21, and transistors 32.

The semiconductor layer 6 is a layer that includes the semiconductor substrate 21, that maintains the mechanical strength of the entire magnetic memory 1, and in that semiconductor devices such as transistors are formed. The magnetic material layer 8 is a layer in that structures of magnetic materials like TMR elements 4 are formed. The wiring layer 7 is provided between the semiconductor layer 6 and the magnetic material layer 8. The wiring layer 7 is a layer in that lines between areas like bit lines 13a, 13b and word lines 14 are formed. Also formed in the wiring layer 7 are wiring lines for establishing mutual electrical connections between the magnetic devices such as the TMR elements 4 formed in the magnetic material layer 8, the semiconductor devices such as the transistors formed in the semiconductor layer 6, the bit lines 13a, 13b, and the word lines 14.

First, the semiconductor layer 6 will be described. The semiconductor layer 6 has the semiconductor substrate 21, an insulating region 22, and transistors 32. The semiconductor substrate 21 is made, for example, of an Si substrate and is doped with a p-type or n-type impurity. The insulating region 22 is formed in the region other than the transistors 32 on the semiconductor substrate 21 and electrically isolates the transistors 32 in mutually adjacent storage areas 3 from each other. The insulating region 22 is made, for example, of an insulating material like $SiO_2$.

With reference to FIG. 3, each transistor 32 is comprised of a drain region 32a and a source region 32c with a conductivity type opposite to that of the semiconductor substrate 21, a gate electrode 32b, and a part of the semiconductor substrate 21. The drain region 32a and source region 32c are formed, for example, by doping the neighborhood of the surface of the Si substrate with an impurity having the conductivity type opposite to that of the semiconductor substrate 21. The semiconductor substrate 21 lies between the drain region 32a and the source region 32c, and the gate electrode 32b is placed above the semiconductor substrate 21. In the transistor 32 constructed in this configuration, when a voltage is applied to the gate electrode 32b, the drain region 32a and source region 32c turn into an electrically conducting state.

Next, the magnetic material layer 8 will be described. With reference to FIG. 2, the magnetic material layer 8 has TMR elements 4, an insulating region 24, and electrodes 31 and 35. In the magnetic material layer 8, the insulating region 24 occupies the regions other than the below-described configuration (TMR elements 4 and electrodes 31 and 35) and other wiring lines. A material for the insulating region 24 can be an insulating material like $SiO_2$ as the insulating region 22 of the semiconductor layer 6 was.

Figure 4:
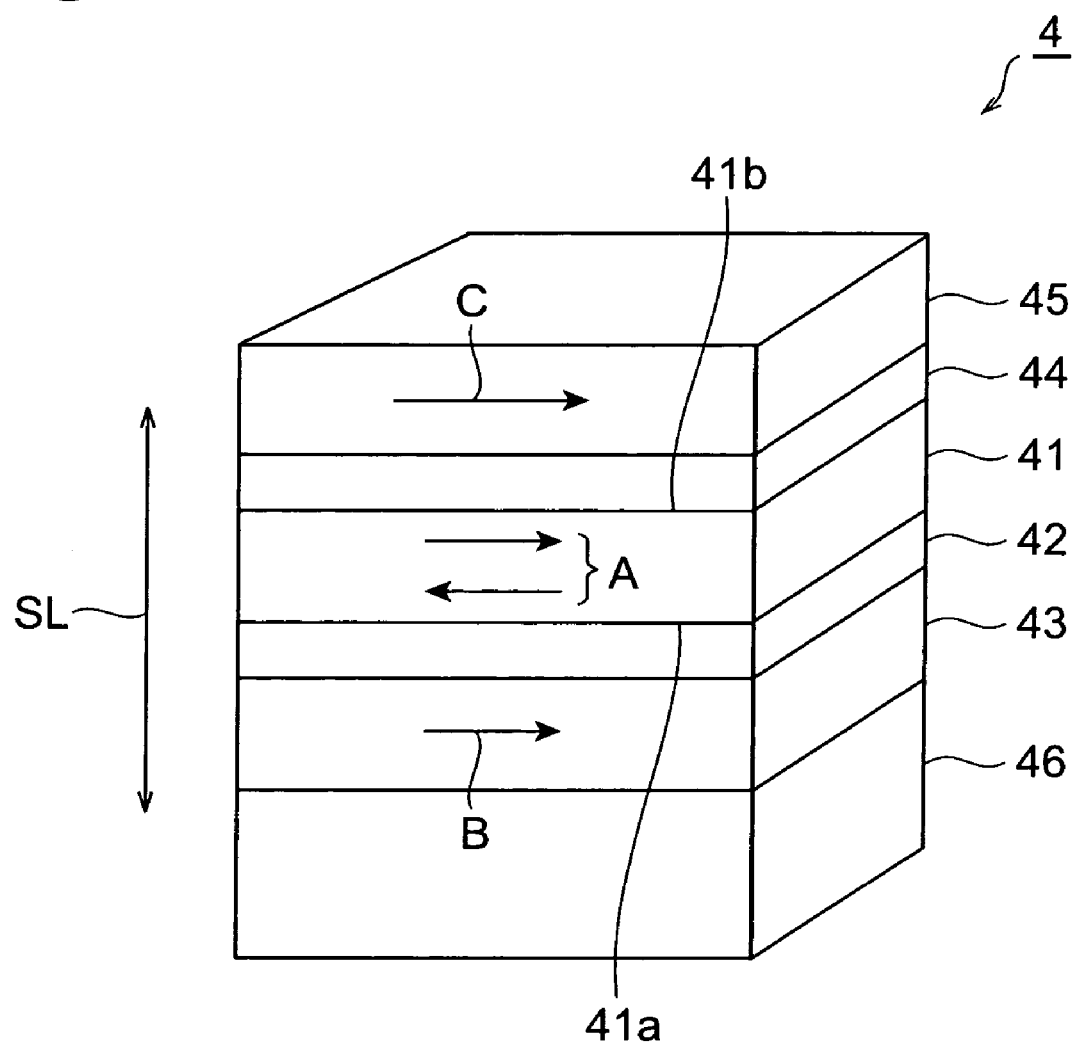
FIG. 4 is an enlarged sectional view of a TMR element.

FIG. 4 is an enlarged perspective view of TMR element 4. With reference to FIG. 4, the TMR element 4 has a first magnetic layer 41, a nonmagnetic insulating layer 42, a second magnetic layer 43, a first nonmagnetic conductive layer 44, a third magnetic layer 45, and an antiferromagnetic layer 46.

The first magnetic layer 41 is a layer in that a bit of binary data (e.g., 0 or 1) is recorded by a direction A of magnetization inside. Namely, the first magnetic layer 41 contains a ferromagnetic material and is formed so that the direction of easy magnetization thereof is approximately perpendicular to the stack direction (arrow SL in the drawing). In the first magnetic layer 41, when a density of an electric current flowing in the stack direction exceeds a certain threshold, the internal magnetization direction A is changed (or reversed) according to the spin direction of the electric current. The first magnetic layer 41 is formed in such a size that the area of the cross section thereof perpendicular to the stack direction SL is not less than 0.001 $\mu m^2$, and less than 0.02 $\mu m^2$. A material for the first magnetic layer 41 can be selected, for example, from ferromagnetic materials such as Co, CoFe, NiFe, NiFeCo, and CoPt, or from materials as arbitrary combinations among them.

The second magnetic layer 43 is a layer in that the magnetization direction B is kept constant. The second magnetic layer 43 contains a ferromagnetic material and is provided above one surface 41a of the first magnetic layer 41 so that the direction of easy magnetization thereof becomes approximately parallel to the direction of easy magnetization of the first magnetic layer 41. The second magnetic layer 43 is preferably configured as follows: in order to prevent the magnetization direction B inside the second magnetic layer 43 from being disturbed by the write current for reversal of the magnetization direction A of the first magnetic layer 41, at least one of the area of the cross section perpendicular to the stack direction SL and the thickness along the stack direction SL is larger than that of the first magnetic layer 41. This configuration requires a very large electric current for varying the magnetization direction B inside the second magnetic layer 43, so as to reduce disturbance of the magnetization direction B inside the second magnetic layer 43 due to the write current for reversal of the magnetization direction A of the first magnetic layer 41. For example, when the sectional area of the second magnetic layer 43 perpendicular to the stack direction SL is not less than double the sectional area of the first magnetic layer 41 perpendicular to the stack direction SL, the magnetization direction B of the second magnetic layer 43 can be stably retained. A material for the second magnetic layer 43 can also be selected, for example, from the ferromagnetic materials such as Co, CoFe, NiFe, NiFeCo, and CoPt, or from materials as arbitrary combinations among them, as in the case of the first magnetic layer 41.

The nonmagnetic insulating layer 42 is a nonmagnetic layer provided between the first magnetic layer 41 and the second magnetic layer 43. The nonmagnetic insulating layer 42 of the present embodiment contains a nonmagnetic and insulating material. The nonmagnetic insulating layer 42 is formed between the first magnetic layer 41 and the second magnetic layer 43 and in a smaller thickness than these layers. When the nonmagnetic insulating layer 42 lies between the first magnetic layer 41 and the second magnetic layer 43, the tunneling magnetoresistive (TMR) effect is produced between the first magnetic layer 41 and the second magnetic layer 43. Namely, the electric resistance between the first magnetic layer 41 and the second magnetic layer 43 largely varies depending upon the relative relation (parallel or antiparallel) between the magnetization direction A of the first magnetic layer 41 and the magnetization direction B of the second magnetic layer 43. A material suitable for the nonmagnetic insulating layer 42 can be selected, for example, from oxides or nitrides of metals such as Al, Zn, and Mg. In the present embodiment, if the nonmagnetic insulating layer 42 is replaced by a nonmagnetic conductive layer containing a nonmagnetic electrically conductive material such as Ru, Rh, Ir, Cu, or Ag, the GMR effect will appear in the first magnetic layer 41.

The first nonmagnetic conductive layer 44 and third magnetic layer 45 are layers for injecting a spin-polarized current with a spin direction biased, into the first magnetic layer 41. The third magnetic layer 45 contains a ferromagnetic material and is provided above another surface 41b of the first magnetic layer 41 so that the direction of easy magnetization thereof becomes approximately parallel to the direction of easy magnetization of the first magnetic layer 41. The magnetization direction C of the third magnetic layer 45 is retained constant. The third magnetic layer 45 is preferably configured as follows: in order to prevent the magnetization direction C inside the third magnetic layer 45 from being disturbed by the write current for reversal of the magnetization direction A of the first magnetic layer 41, the thickness of the third magnetic layer 45 along the stack direction SL is larger than the thickness of the first magnetic layer 41. This configuration requires a very large electric current for varying the magnetization direction C inside the third magnetic layer 45, so as to reduce disturbance of the magnetization direction C inside the third magnetic layer 45 due to the write current for reversal of the magnetization direction A of the first magnetic layer 41. The first nonmagnetic conductive layer 44 contains a nonmagnetic and electrically conductive material and is provided on the other surface 41b of the first magnetic layer 41 and between the first magnetic layer 41 and the third magnetic layer 45. A material for the third magnetic layer 45 can be selected, for example, from the ferromagnetic materials such as Co, CoFe, NiFe, NiFeCo, and CoPt, or from materials as arbitrary combinations among them, as in the case of the first magnetic layer 41. A material for the first nonmagnetic conductive layer 44 can be selected, for example, from nonmagnetic conductive materials such as Ru, Rh, Ir, Cu, and Ag, or from materials as arbitrary combinations among them.

The antiferromagnetic layer (Exchange layer; Pin layer) 46 is a layer for retaining the magnetization direction B of the second magnetic layer (Pinned layer) 43 along a fixed direction. The antiferromagnetic layer 46 contains an antiferromagnetic material and is provided on a surface opposite to a surface of the second magnetic layer 43 opposed to the first magnetic layer (Free layer) 41. Then exchange coupling occurs between the antiferromagnetic layer 46 and the second magnetic layer 43 to stabilize the magnetization direction B of the second magnetic layer 43. A material for the antiferromagnetic layer 46 can be selected from IrMn, PtMn, FeMn, PtPdMn, and NiO, or from materials as arbitrary combinations among them.

Referring again to FIG. 2, an electrode 31 is provided on each TMR element 4. The electrode 31 is made of an electrically conductive metal and extends along the row direction of storage area 3. The electrode 31 is provided on the third magnetic layer 45 of the TMR element 4 shown in FIG. 4, is electrically connected to an end face of the TMR element 4 on the third magnetic layer 45 side, and is electrically connected through vertical lines 16a and 16b to a bit line 13a inside the wiring layer 7. Each TMR element 4 is provided on an electrode 35. An end face of the TMR element 4 on the antiferromagnetic layer 46 (cf. FIG. 4) side is electrically connected to the electrode 35. The electrode 35 is electrically connected through writing lines (described later) provided inside the wiring layer 7, to a transistor 32. When a write current or read current is allowed to flow between the electrode 31 and the electrode 35, the electric current can be made to flow along the stack direction SL (cf. FIG. 4) and through the TMR element 4.

Referring again to FIGS. 2 and 3, the wiring layer 7 will be described. The wiring layer 7 has the insulating region 23, bit lines 13a and 13b, word lines 14, and a plurality of vertical lines and horizontal lines. In the wiring layer 7, the insulating region 23 occupies all the regions except for the lines. A material for the insulating region 23 can be an insulating material like $SiO_2$ as that for the insulating region 22 of the semiconductor layer 6 was. A material for the vertical lines can be, for example, W, and a material for the bit lines 13a and 13b, word lines 14, and horizontal lines can be, for example, A1.

The bit lines 13a and 13b are wires arranged corresponding to respective columns of storage areas 3. A bit line 13a is electrically connected through vertical lines 16a and 16b to electrodes 31 of respective storage areas 3 in a corresponding column. This results in electrically connecting the bit line 13a to one end of each TMR element 4 on the third magnetic layer 45 side. A bit line 13b is electrically connected to source regions 32c of transistors 32 of respective storage areas 3 in a corresponding column. Specifically, a bit line 13b is electrically connected through horizontal lines 18b shown in FIG. 3, to vertical lines 16e, while each vertical line 16e is in ohmic contact with the source region 32c of transistor 32.

The word lines 14 are wires arranged corresponding to the respective rows of storage areas 3. A word line 14 is electrically connected to gate electrodes 32b being control terminals of transistors 32 of respective storage areas 3 in a corresponding row. In the present embodiment parts of word line 14 also serve as gate electrodes 32b of transistors 32. Namely, each gate electrode 32b shown in FIG. 3 is constructed of a part of word line 14 extending in the row direction of storage area 3.

An electrode 35 in the magnetic material layer 8 is electrically connected through a vertical line 16c and a horizontal line 18a in the wiring layer 7 to a vertical line 16d, while the vertical line 16d is in ohmic contact with the drain region 32a of transistor 32. This results in electrically connecting one end of each TMR element 4 on the antiferromagnetic layer 46 side to the drain region 32a of transistor 32.

The magnetic memory 1 having the above configuration is able to operate as follows. Namely, for writing binary data in a certain storage area 3, a control voltage is applied to a word line 14 passing the storage area 3. This results in applying the control voltage to the gate electrode 32b of the transistor 32 in the storage area 3, so as to establish an electrically conducting state between the drain region 32a and the source region 32c. Furthermore, a positive or negative write current according to the binary data is supplied between the bit line 13a and bit line 13b passing the storage area 3. This reverses the magnetization direction A of the first magnetic layer 41 of the TMR element 4.

For reading binary data out of a storage area 3, a control voltage is applied to a word line 14 passing the storage area 3, and a read current in such a magnitude as not to reverse the magnetization direction A of the first magnetic layer 41 is supplied between bit line 13a and bit line 13b. By measuring a resistance between the two end faces of the TMR element 4 crossing the stack direction SL, the binary data stored in the storage area 3 can be read out. The resistance between the two ends of the TMR element 4 can be measured, for example, by measuring a voltage drop amount in the TMR element 4 with supply of the read current.

The operation of the TMR element 4 in the present embodiment will be described in further detail. First described is the spin polarization action by the first nonmagnetic conductive layer 44 and third magnetic layer 45 on the occasion of writing binary data in the TMR element 4. Normally, in an electric current flowing along the stack direction SL in the TMR element 4, an energy state of an electron with an upward spin (up spin) is different from an energy state of an electron with a downward spin (down spin). Therefore, there is a difference between a transmittance (or reflectance) of electrons with the up spin and a transmittance (or reflectance) of electrons with the down spin, at a junction (interface) between a ferromagnetic layer and a nonmagnetic layer. This causes the spin direction of electrons flowing from the third magnetic layer 45 side into the first magnetic layer 41 to be biased toward the magnetization direction C of the third magnetic layer 45 and causes the spin direction of electrons flowing from the second magnetic layer 43 side into the first magnetic layer 41 to be biased toward the direction opposite to the magnetization direction C of the third magnetic layer 45. In this manner, a spin-polarized current with the spin direction different according to the direction of the electric current is injected into the first magnetic layer 41.

When a spin-polarized current is injected into the first magnetic layer 41, exchange interaction occurs between spin-polarized electrons included in this spin-polarized current and electrons inside the first magnetic layer 41, and the magnetization direction A of the first magnetic layer 41 is varied by a torque generated between these electrons. Since the spin direction of the spin-polarized electrons flowing from the third magnetic layer 45 side into the first magnetic layer 41 is opposite to the spin direction of the spin-polarized electrons flowing from the second magnetic layer 43 side into the first magnetic layer 41, a direction of the variation in the magnetization direction A of the first magnetic layer 41 (i.e., a direction of reversal) is determined by the flowing direction of the spin-polarized current. Therefore, the magnetization direction A of the first magnetic layer 41 turns into a direction according to the direction of the electric current flowing in the TMR element 4, and therefore binary data can be written by the plus or minus of the write current supplied to the TMR element 4.

Figure 5:
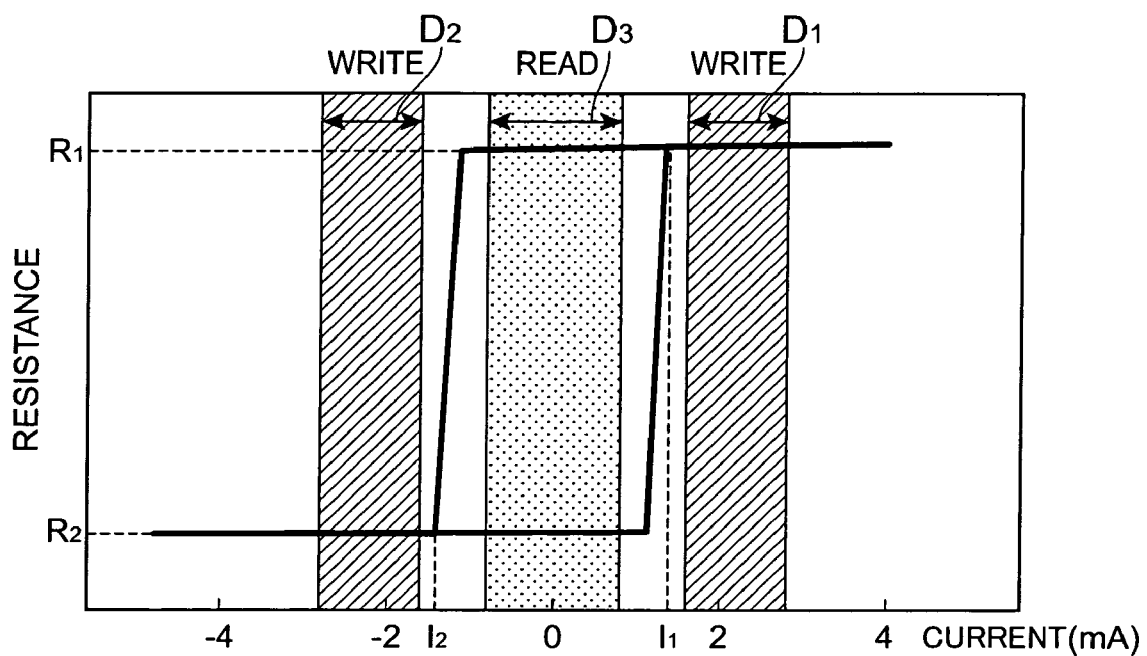
FIG. 5 is a graph showing correlation between electric current and resistance in a TMR element.

FIG. 5 is a graph showing the correlation between electric current and resistance in the TMR element 4. In the graph of FIG. 5, for example, positive current values are taken where the electric current flows from the antiferromagnetic layer 46 side to the third magnetic layer 45 side and negative current values are taken where the electric current flows from the third magnetic layer 45 side to the antiferromagnetic layer 46 side. Supposing at the present moment the magnetization direction A of the first magnetic layer 41 is parallel to the magnetization direction B of the second magnetic layer 43, the resistance between the two ends of TMR element 4 is a relatively small value $R_2$. As the electric current (absolute value) flowing in the TMR element 4 is gradually increased along the positive direction from 0 mA, the magnetization direction A of the first magnetic layer 41 is completely reversed with the electric current over a threshold (critical current) $I_1$. Therefore, the magnetization direction A of the first magnetic layer 41 becomes antiparallel to the magnetization direction B of the second magnetic layer 43, and the resistance between the two ends of TMR element 4 increases to a value $R_1$ larger than the value $R_2$ by the TMR effect. Conversely, as the electric current (absolute value) flowing in the TMR element 4 is gradually increased along the negative direction from 0 mA and from the state in which the magnetization direction A of the first magnetic layer 41 is antiparallel to the magnetization direction B of the second magnetic layer 43, the magnetization direction A of the first magnetic layer 41 is again reversed with the current value over a threshold (critical current) $I_2$. Therefore, the magnetization direction A of the first magnetic layer 41 becomes parallel to the magnetization direction B of the second magnetic layer 43, and the resistance between the two ends of TMR element 4 reduces to the value $R_2$ smaller than the value $R_1$ by the TMR effect.

It is seen from the above that a bit of binary data (e.g., 0) can be written in the TMR element 4 by supplying a positive write current with the absolute value larger than the threshold $I_1$ (e.g., which is included in the range $D_1$ shown in FIG. 5) to the TMR element 4. The other bit of binary data (e.g., 1) can be written in the TMR element 4 by supplying a negative write current with the absolute value larger than the threshold $I_2$ (e.g., which is included in the range $D_2$) to the TMR element 4. The binary data written in the TMR element 4 can be read out by supplying a positive or negative read current with the absolute value smaller than the thresholds $I_1$, $I_2$ (e.g., which is included in the range $D_3$) to the TMR element 4, so as not to reverse the magnetization direction A of the first magnetic layer 41.

The effects of the magnetic memory 1 of the present embodiment described above will be described. In the magnetic memory 1 of the present embodiment, the magnetization direction A of the first magnetic layer 41 in each TMR element 4 can be varied by direct flow of the electric current in the TMR element 4, instead of the external magnetic field such as the magnetic field of the electric current. In addition, the spin-polarized current is generated by the first nonmagnetic conductive layer 44 and the third magnetic layer 45, so that the magnetization direction A of the first magnetic layer 41 can be varied by the relatively small write current. With the magnetic memory 1 of the present embodiment, therefore, there is no leakage of the magnetic field to the other TMR elements than the TMR element as an object to be written, and erroneous writing can be effectively prevented.

Since in each TMR element 4 of the present embodiment the magnetization direction A of the first magnetic layer 41 is reversed by the spin-polarized current, the demagnetizing field does not increase inside the first magnetic layer 41 and the electric current necessary for reversal of the magnetization direction becomes smaller with decrease in the planar size of the first magnetic layer 41. With the TMR element 4 and magnetic memory 1 of the present embodiment, therefore, it becomes easy to achieve miniaturization of TMR element 4 and to achieve higher integration of magnetic memory 1.

In each TMR element 4 of the present embodiment the nonmagnetic insulating layer 42 is provided between the first magnetic layer 41 with the varying magnetization direction and the second magnetic layer 43 with the fixed magnetization direction. This produces the TMR effect between the first magnetic layer 41 and the second magnetic layer 43, so that the resistance change rate (i.e., ($R_2$−in the graph shown in FIG. 5) by the variation of the magnetization direction A of the first magnetic layer 41 can be made relatively large. With the TMR element 4 and magnetic memory 1 of the present embodiment, therefore, it is feasible to quickly and stably read out the data stored by the magnetization direction A of the first magnetic layer 41.

Figure 7:
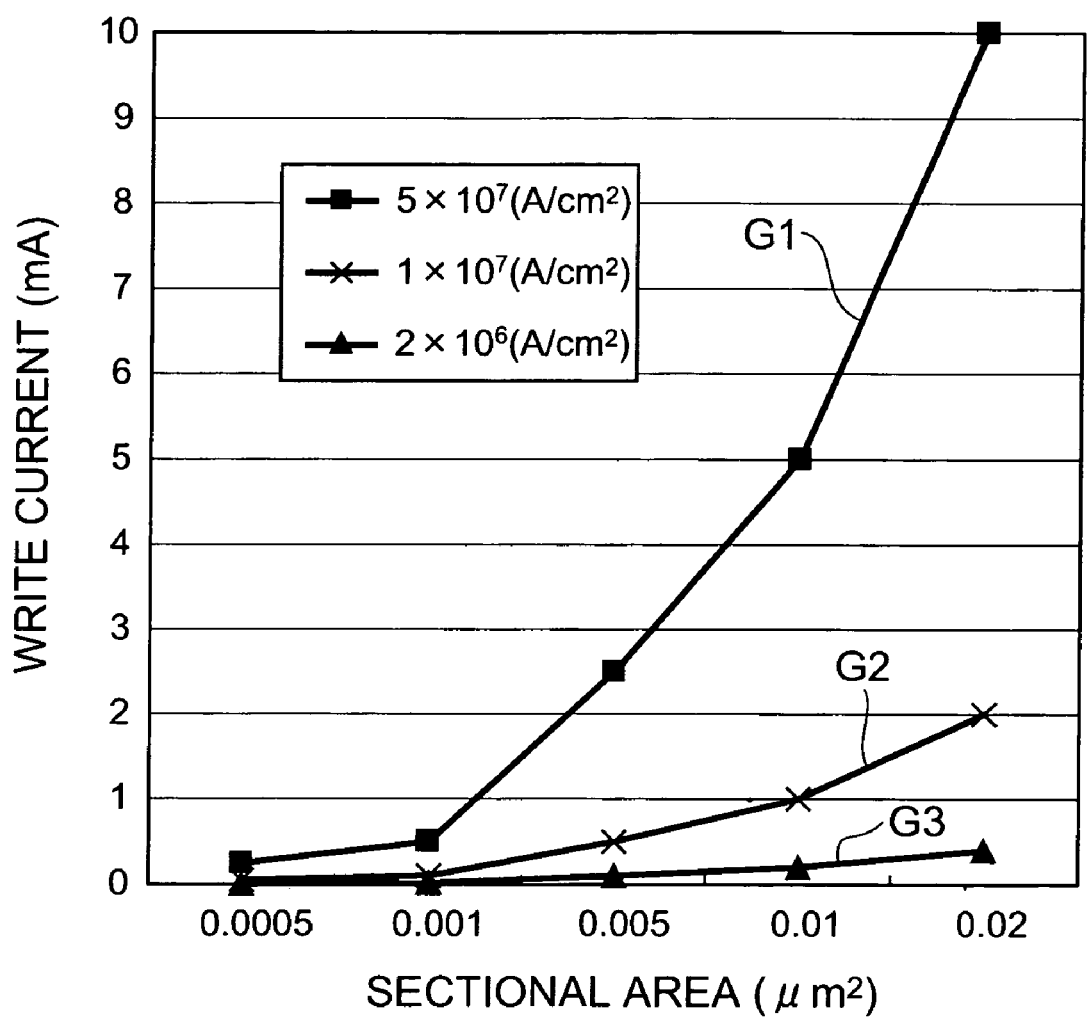
FIG. 7 is a graph obtained by plotting the table shown in FIG. 6.

In the magnetic memory 1 of the present embodiment, the area of the cross section of the first magnetic layer 41 perpendicular to the stack direction SL in each TMR element 4 is not less than 0.001 $\mu m^2$. FIG. 6 is a table showing the results of write current values with variation in the area of the cross section of the first magnetic layer 41 perpendicular to the stack direction SL from 0.0005 $\mu m^2$ to 5 $\mu m^2$ in a case where the current density is $5 \times 10^7$ (A/cm$^2$), in a case where the current density is $1 \times 10^7$ (A/cm$^2$), and in a case where the current density is $2 \times 10^6$ (A/cm$^2$). The graph shown in FIG. 7 is one obtained by plotting the values in the table shown in FIG. 6, in which the vertical axis represents write current values and the horizontal axis sectional areas of the first magnetic layer 41. In FIG. 7, graph G1 indicates the case where the current density is $5 \times 10^7$ (A/cm$^2$), graph G2 the case where the current density is $1 \times 10^7$ (A/cm$^2$), and graph G3 the case where the current density is $2 \times 10^6$ (A/cm$^2$).

According to Inventor's knowledge, the magnetic resistance ratio (MR ratio) of the current TMR elements is said to be about 40%, and in practice it is 20% or less in many cases from manufacturing restrictions. In addition, the variation is large in resistance. For this reason, the current amount of the read current is preferably at least 0.1 mA in order to accurately measure the electric resistance by the magnetoresistive effect such as the TMR effect, without being affected by noise or the like. On the other hand, it is reported by some researchers that where the magnetization reversal of the first magnetic layer 41 is effected by the spin-polarized current in writing binary data in the magnetoresistive effect element such as the TMR element 4 as in the present embodiment, the magnetization reversal of the first magnetic layer 41 can be achieved if the density of the write current to be supplied to the first magnetic layer 41 is not less than $2 \times 10^6$ A/cm$^2$. However, according to Inventor's knowledge, the density of the write current is preferably not less than $1 \times 10^7$ A/cm$^2$ in order to securely reverse the magnetization direction A of the first magnetic layer 41. In addition, current amounts of the minimum write current necessary for reversal of the magnetization direction A of the first magnetic layer 41 ($I_1$, $I_2$ in FIG. 5) have to be larger than the read current amount, in order to prevent the magnetization direction A of the first magnetic layer 41 from being reversed by the read current. It is seen from these that when the area of the cross section of the first magnetic layer 41 perpendicular to the stack direction SL is not less than 0.001 $\mu m^2$ with which the current amount of 0.1 mA is ensured at the current density of $1 \times 10^7$ A/cm$^2$ (cf. FIGS. 6 and 7), the electric resistance by the magnetoresistive effect can be accurately measured in reading of data and the magnetization reversal of the first magnetic layer 41 by the spin-polarized current can be suitably achieved in writing of data. In order to perfectly prevent the magnetization reversal of the first magnetic layer 41 due to the read current, the sectional area of the first magnetic layer 41 is preferably set so that the current amounts $I_1$, $I_2$ of the minimum write current for magnetization reversal of the first magnetic layer 41 are not less than 5 times the read current amount, and more preferably set so that they are not less than 10 times the read current.

In the magnetic memory 1 of the present embodiment, the area of the cross section of the first magnetic layer 41 perpendicular to the stack direction SL in each TMR element 4 is less than 0.02 $\mu m^2$. According to Inventor's knowledge, if the current amount of the write current is not less than 10 mA, the planar size of transistor 32 for controlling conduction of the write current in each storage area 3 will be so large as to impose restrictions on achievement of high integration of the magnetic memory 1, even with miniaturization of the TMR elements 4. For securely reversing the magnetization direction A of the first magnetic layer 41, a sufficient density of the write current to be supplied to the first magnetic layer 41 is $5 \times 10^7$ A/cm$^2$. Therefore, when the area of the cross section of the first magnetic layer 41 perpendicular to the stack direction SL is less than 0.02 µm$^2$ with which the current amount of 10 mA is ensured at the current density of $5 \times 10^7$ A/cm$^2$ (cf. FIGS. 6 and 7), the transistors 32 and TMR elements 4 both can be formed in compact size and the magnetic memory 1 can be arranged in high integration.

A production method of a TMR element 4 and a neighboring structure thereof out of a production method of magnetic memory 1 of the present embodiment will be described with reference to FIGS. 8A, 8B, and 8C and FIGS. 9A, 9B, and 9C. FIGS. 8A, 8B, 8C and FIGS. 9A, 9B, 9C all are cross sections along line I-I in FIG. 1 and show production steps thereof in order.

Figure 8A:
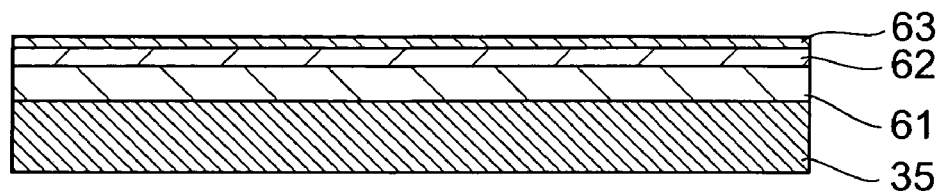
FIGS. 8A, 8B, and 8C are views showing a method of producing a TMR element and a neighboring structure thereof.
Figure 8B:
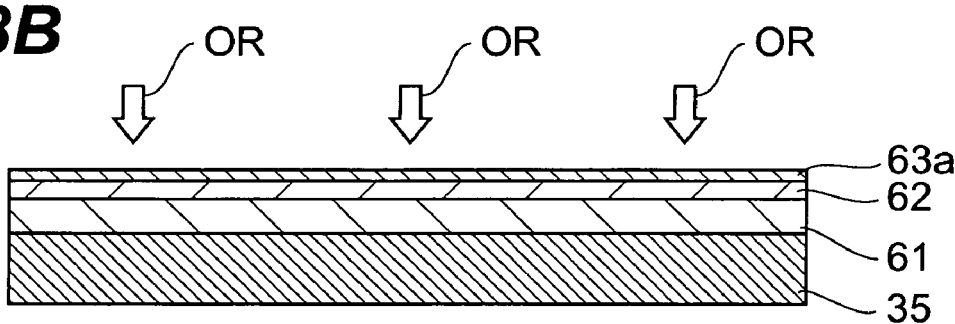
Figure 8C:
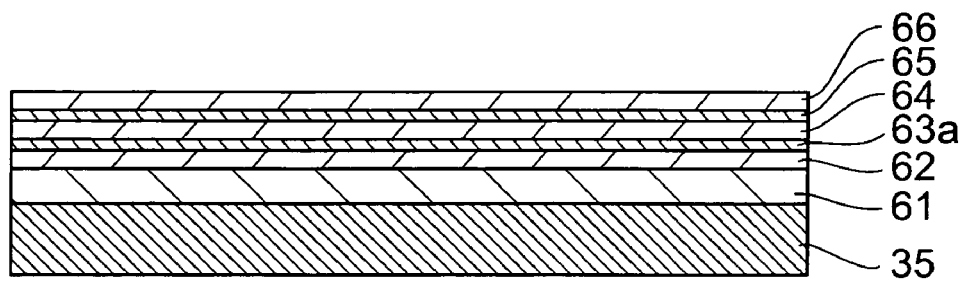

First, as shown in FIG. 8A, electrode 35 of Cu is formed on a wiring layer. Then a high-vacuum sputtering system is used to deposit an IrMn layer 61 intended for the antiferromagnetic layer, a CoFe layer 62 intended for the second magnetic layer, and a metal layer 63 in order on the electrode 35. At this time, a material of the metal layer 63 may be at least one kind out of Al, Zn, and Mg, for example. Subsequently, as shown in FIG. 8B, the metal layer 63 is oxidized by oxygen radical OR (radical oxidation method) to form a tunnel insulating layer 63a intended for the nonmagnetic insulating layer. Thereafter, as shown in FIG. 8C, a CoFe layer 64 intended for the first magnetic layer, a Cu layer 65 intended for the first nonmagnetic conductive layer, a CoFe layer 66 intended for the third magnetic layer, and a Ta protecting layer (not shown) are sequentially deposited on the tunnel insulating layer 63a.

Figure 9A:
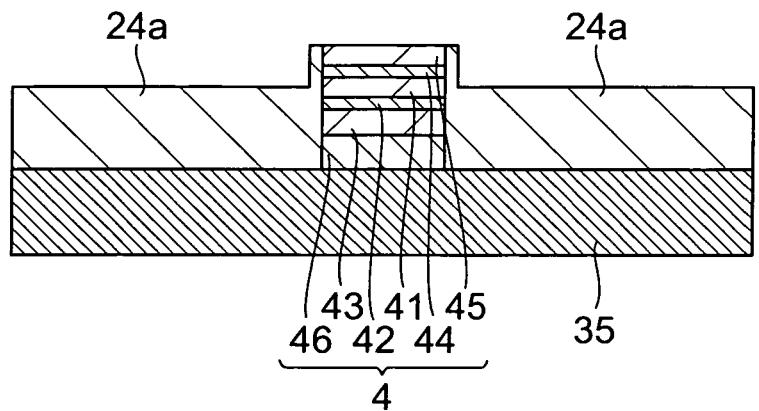
FIGS. 9A, 9B, and 9C are views showing a method of producing a TMR element and a neighboring structure thereof.

Subsequently, a resist mask is formed on the Ta protecting layer so that the area, when viewed from the stack direction, is in the range of 0.001 µm$^2$ to 0.02 µm$^2$. Then ion milling is performed to etch the IrMn layer 61, CoFe layer 62, tunnel insulating layer 63a, CoFe layer 64, Cu layer 65, and CoFe layer 66, thereby forming the antiferromagnetic layer 46, second magnetic layer 43, nonmagnetic insulating layer 42, first magnetic layer 41, first nonmagnetic conductive layer 44, and third magnetic layer 45, as shown in FIG. 9A. In this manner, the TMR element 4 is formed. After the formation of the TMR element 4, a CVD system is used to form an SiO$_2$ insulating layer 24a over the entire region except for the region on the third magnetic layer 45, for example, with Si(OC$_2$H$_5$)$_4$. After this step, the resist mask is removed.

Figure 9B:
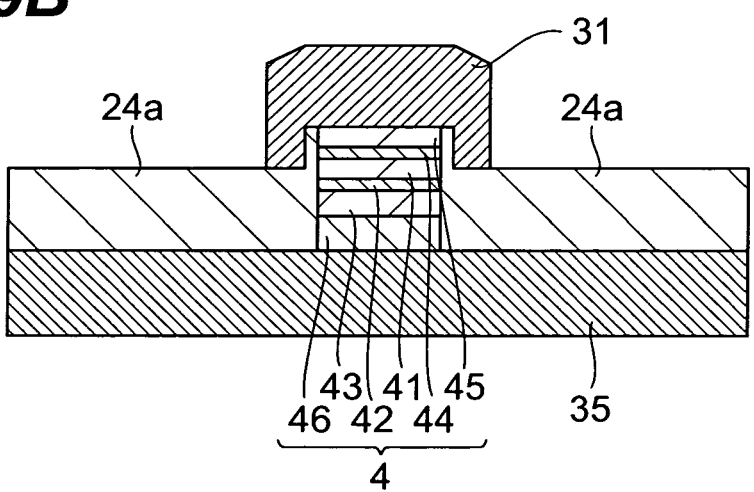

Subsequently, a resist mask with an aperture according to the planar shape of electrode 31 is formed on the SiO$_2$ insulating layer 24a. Then a Ti layer and a Cu layer are sequentially deposited by sputtering and thereafter the resist mask is removed. In this manner, as shown in FIG. 9B, the electrode 31 is formed on the TMR element 4.

Figure 9C:
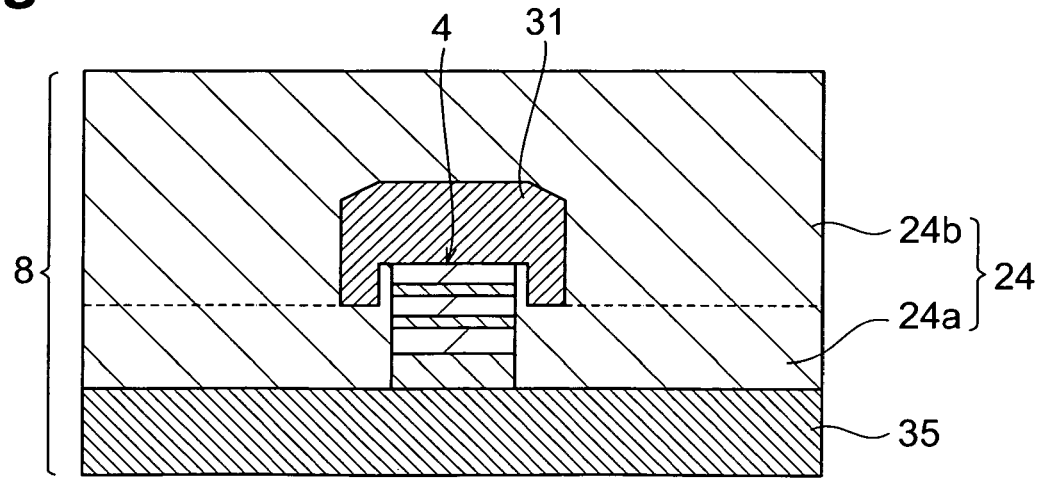

In the last step, as shown in FIG. 9C, an SiO$_2$ insulating layer 24b of the same material as the SiO$_2$ insulating layer 24a is formed over the entire surface on the SiO$_2$ insulating layer 24a and on the electrode 31 by CVD. This forms the insulating region 24 consisting of the SiO$_2$ insulating layers 24a and 24b, thus completing the magnetic material layer 8.

(Modification Examples)

Figure 10:
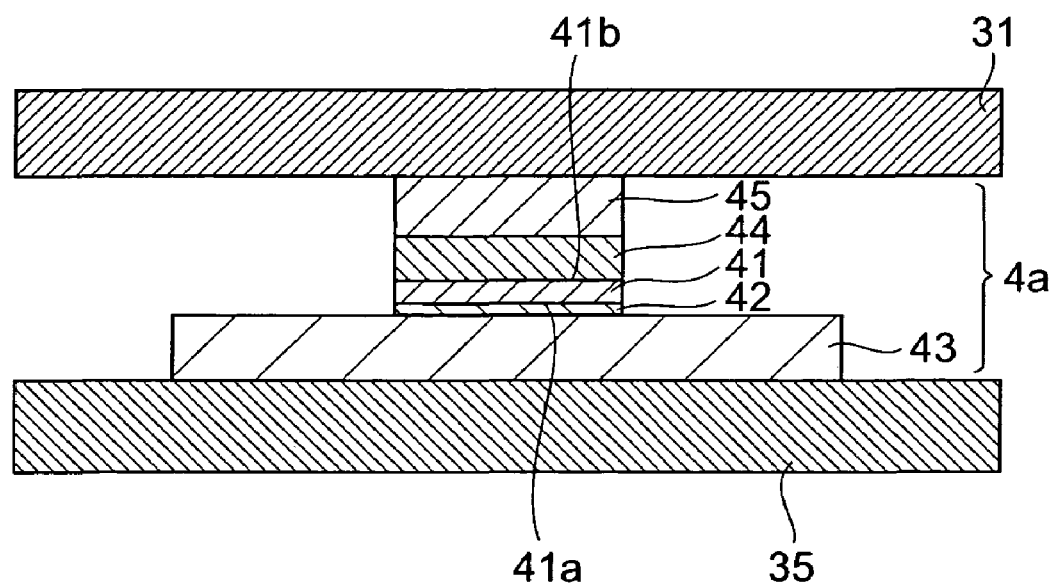
FIG. 10 is a sectional view showing a configuration of a modification example of a TMR element.
Figure 11:
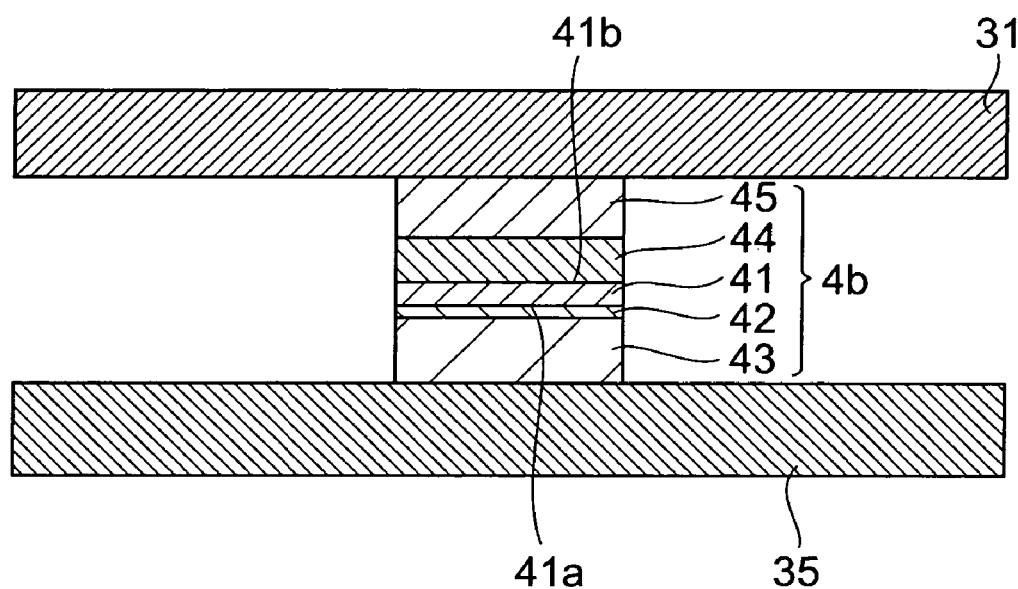
FIG. 11 is a sectional view showing a configuration of a modification example of a TMR element.
Figure 12:
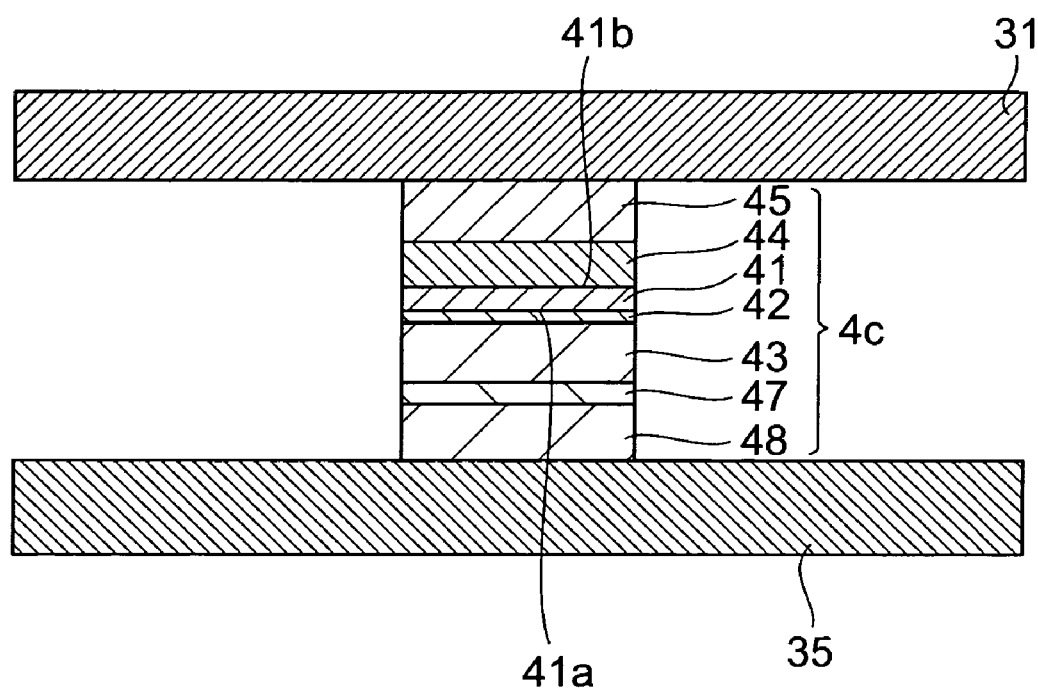
FIG. 12 is a sectional view showing a configuration of a modification example of a TMR element.

Modification examples of the magnetic memory 1 according to the present embodiment will be described below. FIGS. 10, 11, and 12 are sectional views showing configurations of TMR elements 4a-4c according to the respective modification examples. When the magnetic memory is provided with the TMR elements 4a-4c of the modification examples, instead of the TMR elements 4 of the above embodiment, it can enjoy the effects similar to those of the magnetic memory 1 of the above embodiment.

First, referring to FIGS. 10 and 11, the TMR elements 4a and 4b are comprised of a first magnetic layer 41, a nonmagnetic insulating layer 42, a second magnetic layer 43, a first nonmagnetic conductive layer 44, and a third magnetic layer 45. The TMR elements 4a and 4b of these modification examples are different from the TMR element 4 of the above embodiment in that the TMR elements do not have the antiferromagnetic layer 46 and in that the second magnetic layer 43 is in contact with the electrode 35. Even in these cases where the element is not provided with the layer for stably retaining the magnetization direction of the second magnetic layer 43, the magnetization direction of the second magnetic layer 43 can be kept fixed by making the area of the cross section of the second magnetic layer 43 perpendicular to the stack direction, larger than that of the first magnetic layer 41, as shown in FIG. 10, or by making the thickness of the second magnetic layer 43 in the stack direction larger than that of the first magnetic layer 41, as shown in FIG. 11.

Next referring to FIG. 12, TMR element 4c is comprised of a first magnetic layer 41, a nonmagnetic insulating layer 42, a second magnetic layer 43, a first nonmagnetic conductive layer 44, a third magnetic layer 45, a second nonmagnetic conductive layer 47, and a fourth magnetic layer 48. The TMR element 4c of the present modification example is different from the TMR element 4 of the above embodiment in that the second nonmagnetic conductive layer 47 and fourth magnetic layer 48 are provided instead of the antiferromagnetic layer 46.

The second nonmagnetic conductive layer 47 and fourth magnetic layer 48 are layers for keeping the magnetization direction of the second magnetic layer 43 along a fixed direction. The fourth magnetic layer 48 contains a ferromagnetic material and is provided above a surface opposite to a surface of the second magnetic layer 43 opposed to the first magnetic layer 41. The magnetization direction of the fourth magnetic layer 48 is fixed. The second nonmagnetic conductive layer 47 contains a nonmagnetic and electrically conductive material and is provided above one surface 41a of the first magnetic layer 41 and between the second magnetic layer 43 and the fourth magnetic layer 48. The fourth magnetic layer 48 establishes antiferromagnetic coupling with the second magnetic layer 43 through the second nonmagnetic conductive layer 47 to further stabilize the magnetization direction of the second magnetic layer 43. Since this configuration prevents the impact of the static magnetic field from the second magnetic layer 43 on the first magnetic layer 41, the magnetization reversal of the first magnetic layer 41 can be readily achieved. A material for the fourth magnetic layer 48 can be selected, for example, from the ferromagnetic materials such as Co, CoFe, NiFe, NiFeCo, and CoPt, or from materials as arbitrary combinations among them, as in the case of the first magnetic layer 41. A material for the second nonmagnetic conductive layer 47 can be selected, for example, from the nonmagnetic conductive materials such as Ru, Rh, Ir, Cu, and Ag, or from materials as arbitrary combinations among them. The thickness of the second nonmagnetic conductive layer 47 is preferably not more than 2 nm in order to obtain strong antiferromagnetic coupling between the second magnetic layer 43 and the fourth magnetic layer 48.

The magnetic memory according to the present invention is not limited to the embodiment described above, but a variety of other modifications can be contemplated. For example, the above embodiment adopted the TMR elements as the magnetoresistive effect elements, but the GMR elements may also be adopted. In this case, a nonmagnetic conductive layer containing a nonmagnetic and electrically conductive material should be provided instead of the nonmagnetic insulating layer in the TMR elements of the above embodiment.

What is claimed is:

1. A magnetic memory comprising a plurality of storage areas each of which has a magnetoresistive effect element, wherein the magnetoresistive effect element comprises:
    a first magnetic layer which contains a ferromagnetic material and a magnetization direction of which varies according to a density and a spin direction of an electric current flowing in a stack direction;
    a second magnetic layer which contains a ferromagnetic material, which is provided above one surface of the first magnetic layer, and a magnetization direction of which is fixed;
    a nonmagnetic layer which contains a nonmagnetic material and which is provided between the first magnetic layer and the second magnetic layer;
    a third magnetic layer which contains a ferromagnetic material, which is provided above another surface of the first magnetic layer, and a magnetization direction of which is fixed; and
    a first nonmagnetic conductive layer which contains a nonmagnetic and electrically conductive material and which is provided between the first magnetic layer and the third magnetic layer, and
    wherein an area of a cross section of the first magnetic layer perpendicular to the stack direction is not less than 0.001 $\mu m^2$, and less than 0.02 $\mu m^2$.

2. The magnetic memory according to claim 1, wherein a thickness of the second magnetic layer in the stack direction is larger than a thickness of the first magnetic layer in the stack direction.

3. The magnetic memory according to claim 1, wherein a thickness of the third magnetic layer in the stack direction is larger than a thickness of the first magnetic layer in the stack direction.

4. The magnetic memory according to claim 1, wherein an area of a cross section of the second magnetic layer perpendicular to the stack direction is larger than the area of the cross section of the first magnetic layer perpendicular to the stack direction.

5. The magnetic memory according to claim 1, further comprising an antiferromagnetic layer containing an antiferromagnetic material and provided on a surface opposite to a surface of the second magnetic layer opposed to the first magnetic layer.

6. The magnetic memory according to claim 1, further comprising:
    a fourth magnetic layer containing a ferromagnetic material and provided above a surface opposite to a surface of the second magnetic layer opposed to the first magnetic layer; and
    a second nonmagnetic conductive layer containing a nonmagnetic and electrically conductive material and provided between the second magnetic layer and the fourth magnetic layer.

7. A magnetic memory comprising a plurality of storage areas each of which has a tunneling magnetoresistive effect element,
    wherein the tunneling magnetoresistive effect element comprises:
    a first magnetic layer which contains a ferromagnetic material and a magnetization direction of which varies according to a density and a spin direction of an electric current flowing in a stack direction;
    a second magnetic layer which contains a ferromagnetic material, which is provided above one surface of the first magnetic layer, and a magnetization direction of which is fixed;
    a nonmagnetic insulating layer which contains a nonmagnetic and insulating material and which is provided between the first magnetic layer and the second magnetic layer;
    a third magnetic layer which contains a ferromagnetic material, which is provided above another surface of the first magnetic layer, and a magnetization direction of which is fixed; and
    a first nonmagnetic conductive layer which contains a nonmagnetic and electrically conductive material and which is provided between the first magnetic layer and the third magnetic layer, and
    wherein an area of a cross section of the first magnetic layer perpendicular to the stack direction is not less than 0.001 $\mu m^2$, and less than 0.02 $\mu m^2$.

* * * * *